United States Patent [19]
Goodman et al.

[11] Patent Number: 4,628,410
[45] Date of Patent: Dec. 9, 1986

[54] SURFACE MOUNTING CONNECTOR

[75] Inventors: David S. Goodman, Mission Viejo; Leland W. Oliver, Santa Ana, both of Calif.

[73] Assignee: ITT Corporation, New York, N.Y.

[21] Appl. No.: 721,748

[22] Filed: Apr. 10, 1985

[51] Int. Cl.$^4$ ............................................. H01R 23/72
[52] U.S. Cl. .................... 361/413; 339/17 C; 339/17 LC; 339/176 M; 339/275 B; 361/408
[58] Field of Search ................ 361/392, 395, 399–400, 361/403, 408, 113; 339/17 C, 17 L, 17 LC, 143 R, 275 B, 176 M, 14 R; 357/68, 74, 80; 174/52 FP, 35 R

[56] References Cited

U.S. PATENT DOCUMENTS

| | | | |
|---|---|---|---|
| 4,232,929 | 11/1980 | Zobawa | 339/17 LC X |
| 4,381,602 | 5/1983 | McIver | 174/52 FP X |
| 4,407,007 | 9/1983 | Desai et al. | 357/68 X |
| 4,410,230 | 10/1983 | San Miguel | 339/275 B X |
| 4,513,355 | 4/1985 | Schroeder et al. | 174/52 FP X |

OTHER PUBLICATIONS

Bowlby, Reed, "The DIP May Take Its Final Blows", IEEE Spectrum, Jun. 1985, p. 37.
Mollen, J. C., "High-Density Cable Connector System", IBM Technical Disclosure Bulletin, Apr. 1978, vol. 20, No. 11A, p. 4311.

Primary Examiner—A. T. Grimley
Assistant Examiner—Jane K. Lau
Attorney, Agent, or Firm—T. L. Peterson; R. C. Turner

[57] ABSTRACT

A connector is described, of a type which can be connected to a circuit board by merely laying it on the board and soldering it in place by a reflow solder technique. The connector includes a housing assembly with a substantially flat bottom that includes a solderable portion that can lie on a metal trace of a circuit board to be soldered thereto. The connector includes a row of contacts, each having a main portion within the housing and a tail extending at a downward incline from the housing so the lower end of the tail can contact a metal trace on the circuit board and become soldered thereto.

12 Claims, 5 Drawing Figures

SURFACE MOUNTING CONNECTOR

BACKGROUND OF THE INVENTION

One technique used to attach integrated circuits and other microelectronics components to a circuit board, comprises the laying of the leads of the component on conductive traces of the circuit board and the soldering of the lower ends of the leads to the board as by reflow solder techniques which permit all leads to be soldered in place at once. No mounting holes or other holddowns are required for the body of the component, as the soldering of leads are sufficient to hold them in place. It would be desirable if a connector could be mounted on a circuit board using the same technique. However, connectors are subjected to forces during the insertion and withdrawal of a mating connector that cannot be withstood by prior surface mounting methods.

The forces applied to a connector during mating with a counterpart connector cannot be reliably withstood by the solder connection of their contacts. The mounting of prior art connectors involves the drilling of holes in the circuit board and the provision of corresponding pins or other hold-down on the connector housing for securely retaining it in place on the circuit board. A connector that could be reliably installed on a circuit board using surface mounting techniques, and without requiring holes in the board for receiving projecting fasteners on the connector housing, would reduce the assembly cost of mounting.

SUMMARY OF THE INVENTION

In accordance with one embodiment of the invention, a surface mounting connector is provided for mounting to a circuit board, which enables connector mounting at lower cost. The connector includes a housing assembly which can lie on a circuit board and a group of contacts having tails that extend at downward inclines so their lower portions can contact conductive traces on a circuit board. The housing assembly includes an insulative housing which holds the contacts. The housing assembly also includes a metal plate portion at the bottom which rests substantially flat against a conductive trace on the circuit board so it can be soldered to the circuit board at the same time as the bottom of the contact tails. The contact tails are positioned so they must be deflected slightly in order for the bottom of the housing assembly to lie flat against the circuit board. The bottom of the tails are positioned so that the weight of the housing assembly itself can deflect the tails to allow the housing assembly to lie flat against the circuit board.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
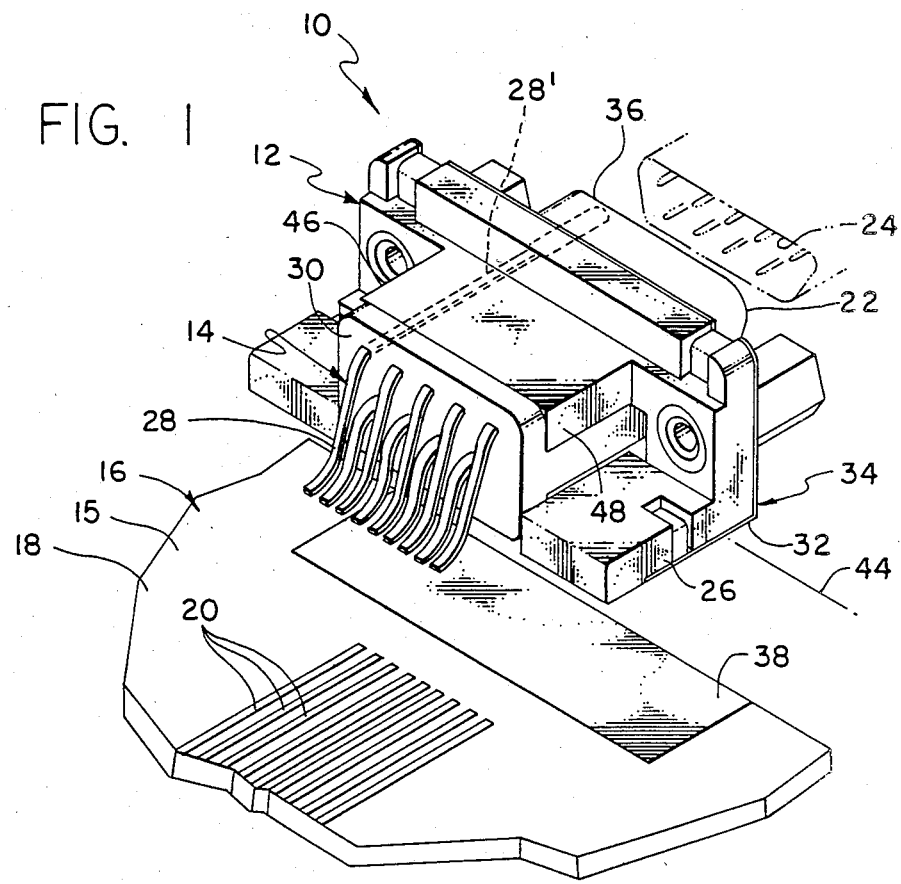
FIG. 1 is an exploded perspective view of a connector and a circuit board constructed in accordance with one embodiment of the present invention.
Figure 2:
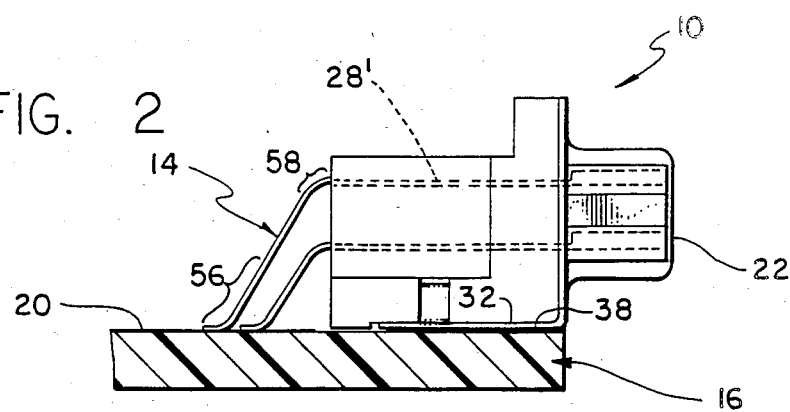
FIG. 2 is a partially sectional side elevation view of the connector and circuit board of FIG. 1.
Figure 3:
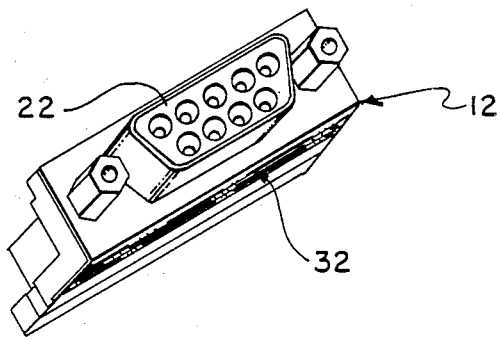
FIG. 3 is a front and bottom perspective view of the connector of FIG. 2.

FIG. 1 illustrates a surface mounting connector 10 which includes a housing assembly 12 and a group of contacts 14. The connector is designed to mount on a connector-receiving region 15 of a printed circuit board 16 which includes an insulative board member or plate 18 and a plurality of electrically conductive traces 20 which extend to electrical components (not shown) on the circuit board. The connector has a front or mating end 22 forming a socket which is designed to mate with and unmate from another connector 24 of opposite gender, to receive and deliver signals from circuitry from outside of the circuit board. The housing assembly includes a housing 26 of insulative material, in which the contacts 14 are embedded. Each contact includes a main portion 28' embedded in the housing and forming a socket at the front end of the housing, and a tail 28 that extends in a rearward and downward incline from the rearward end 30 of the housing.

A technique that has been used to mount circuit components, such as integrated circuits onto a printed circuit board, is a surface mounting technique wherein the soldering of the leads of the component onto the traces of the circuit board has been used to hold the component in place. In such a mounting technique, no holes have been formed in the circuit board for reception of pegs or other fasteners extending from the component, but only the holding power of the leads to the circuit board has been relied upon. By using only the weight of the component, along with some adhesion due to the solder paste, to hold it in position until reflow soldering or the like is used to solder the leads in place. The surface mounting techniques has greatly simplified the mounting of components onto a circuit board. Such mounting technique has not been used for the mounting of connectors on circuit boards for primarily two reasons. A first reason is that connectors are subjected to appreciable loads during the mating and unmating of other connectors therefrom, and the leads cannot reliably withstand such forces. A second reason is that when the leads press against traces on the circuit board prior to soldering, it is quite likely for the housing of the connector to be tilted so its bottom surface does not lie flat against the circuit board. Such an orientation of the connector housing so its bottom surface is at an appreciable angle from the plane of the printed circuit is not allowable.

In accordance with one aspect of the present invention, the housing assembly 12 is constructed to enable its strong attachment to the circuit board 16 by the provision of a wide area solderable metal portion 32 at the bottom of the housing assembly. The housing assembly includes a ground plate 34 which, as is usual with connectors of this type, includes a portion 36 that surrounds the receptacle ends of the contacts. The ground plate 34 extends so that a wide area of the plate lies at the bottom surface of the housing 26 to form a large substantially flat bottom area 32 of the housing assembly. The printed circuit board is provided with a wide area ground trace, or housing solder region 38, to which the bottom metal portion or area 32 of the housing assembly can be soldered. Thus, when the housing assembly 12 is laid on the circuit board with the bottom metal portion 32 lying flat against the housing solder region 38, and with the contact tails 28 against the traces 20, both the housing assembly 12 and the tails of the contacts can be soldered to the circuit board in a single reflow soldering procedure.

Figure 4:
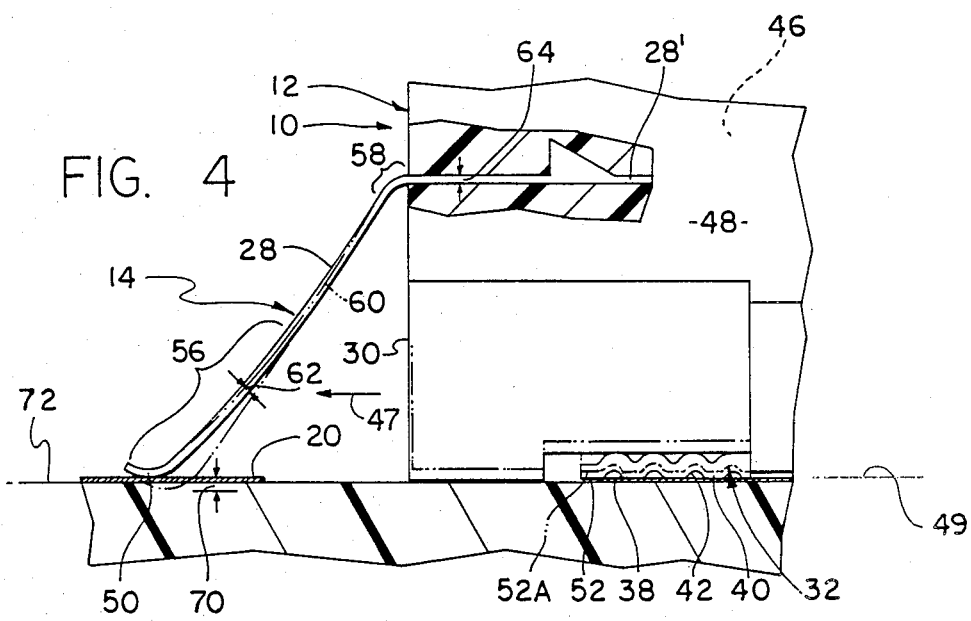
FIG. 4 is an enlarged view of a portion of the connector of FIG. 2.
Figure 5:
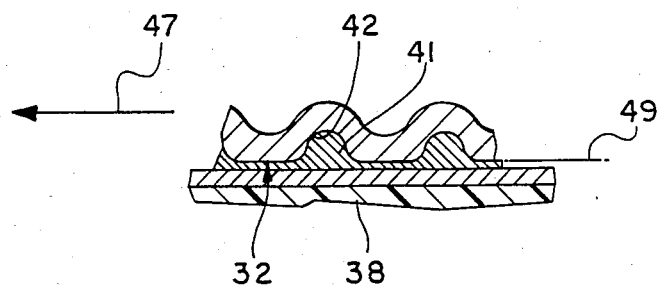
FIG. 5 is an enlarged view of a portion of FIG. 4, showing the connector soldered to the circuit board.

In order to assure reliable attachment of the bottom metal portion 32, it should occupy a large proportion of the bottom of the connector, such as at least 25% thereof. Additional strength is obtained by forming multiple projections and corresponding recesses in the bottom metal portion 32, as shown in FIG. 4. As shown in FIG. 4, the bottom metal portion 32 has multiple ridges 40 separated by multiple shallow grooves 42. The ridges and grooves preferably extend parallel to an axis 44 that extends between opposite sides 46 and 48 of the connector housing, which is perpendicular to an imaginary line that extends between the front and rear ends of the housing. The fillets or ridges of solder, shown at 41 in FIG. 5, that extend into the grooves 42, help to resist forces on the housing in an insertion direction 47 and in the opposite withdrawal direction when another connector is inserted or withdrawn from the connector 10. Multiple castellations can be used instead of ridges and grooves. The bottom surface area 32 lies substantially on an imaginary plane 49, and is substantially flat in that no part of the bottom area lies below the plane 49 to prevent the area from resting stably on a flat surface such as that of the ground trace 38.

As mentioned above, one problem that is faced in using surface mounting techniques for holding down a conventional connector is that the tails 28 (FIG. 4) of the contacts are flexible but stiff and can tilt the housing assembly 12, and the weight of the housing assembly is not sufficient to hold it down flatly to the circuit board. Most contacts 14 are constructed to have high strength by constructing them of a copper base spring alloy. Such high strength exerts a high force and is usually desirable to assure that good and reliable contact is made with the circuit board traces. However, the high spring rate and high yield strength of the contacts results in relatively stiff tails 28 that resist bending. The tails must be formed so their lower portions 50 tend to lie slightly below the level of the circuit board to assure that they will lie against the traces during soldering. If relatively rigid tails are used and only the relatively small weight of the housing is applied to hold it down, it is possible for the rearward end 30 of the housing to be raised so that the bottom surface 52 of the housing assembly, and especially of the bottom metal portion 32, will be raised as to the position 52A where it is spaced considerably from the circuit board and cannot be reliably soldered to the circuit board.

In accordance with another aspect of the invention, the tails 28 of the contacts are made less resilient than the main portion 26 of the contacts that lie within the housing that mate with contacts of another connector. In the connector, the lower portion 56 of each tail is made less resilient so it has a lesser spring rate and lesser yield strength than the main portion 26 of the contact. The very small amount of force required for tail deflection during positioning of a connector to a printed circuit board is provided by the weight of the connector body. (The flat condition of the contact body is further assured, although not required, by adhesion due to the solder paste commonly used in reflow solder techniques.) A lower spring rate is produced in the lower portion 56 of each tail by annealing the lower portion 56. That is, while the main portion of the contact and the upper portion 58 of the tail are of considerable hardness, the lower portion 56 can be annealed to soften it and decrease its spring rate and yield strength.

FIG. 4 shows, in phantom lines, another lower tail portion 60 which is reduced in thickness, so that its thickness 62 is about one-half the thickness 64 of the main contact portion 26 and of the upper end of the tail. A ½ reduction of thickness results in the same deflection of the lower end 50 of the contact with about ⅛th the force.

Another way to reduce the spring rate and yield strength is to manufacture the contact of two different alloys by using a lower stiffness alloy along the lower portion 60 of the tail but connecting (i.e., welding or bonding) it to a higher strength alloy which is used along most of the contact, although this can lead to somewhat higher cost that the other two methods described above.

One connector of the type shown in FIGS. 1–4 has a length, as measured from the front to rear end of its housing, of 18 millimeters and a weight of 8 grams. Each of the tails 28 is coined so that its bottom portion 50 (FIG. 4) lies a distance 70 of about 0.005 inch below an imaginary plane 72 on which the housing assembly bottom can lie flat; thus, the bottom portion of each tail has to be deflected upwardly by only about 0.005 inch. Where the lower portion 60 of each tail has a reduced spring rate and yield strength, the relatively small weight of only about 8 grams of the housing assembly is sufficient to deflect the bottom portions of the tails to be generally even with plane 72. That is, the tails are deflected far enough that the solderable metal portion 32 at the bottom of the housing assembly is not separated from the housing solder region 38 of the circuit board and can be reliably soldered to the circuit board.

The housing assembly 12 of the connector relies solely upon the solder connection of its solderable metal portion 32 to the circuit board to directly connect them. The circuit board 16 is devoid of any holes that receive any rigid projections from the housing assembly where such projections would project appreciably below the level of the solderable metal portion 32 at the bottom of the housing assembly. Instead, the connector 10 can merely be laid in place and reliably soldered to the circuit board.

Thus, the invention provides a surface mountable connector which can be connected to a circuit board by merely laying it in place and soldering the tails of the contacts as well as a metal bottom portion of the housing assembly to metal traces of the circuit board. The housing assembly can include a wide and substantially flat (except for small grooves and recesses between ridges or castellations) solderable metal bottom portion for soldering the assembly to a corresponding solder region of the circuit board. The contacts of the connector can include tails with lower portions of lower spring rate than the main portions of the contacts that lie within the insulative housing of the housing assembly. Such tails have lower portions that lie below the plane of the housing assembly bottom, but can be easily deflected into that plane just by the weight of the housing assembly.

Although particular embodiments of the invention have been described and illustrated herein, it is recognized that modifications and variations may readily occur to those skilled in the art and, consequently, it is intended that the claims be interpreted to cover such modifications and equivalents.

What is claimed is:

1. A surface mounting connector for mounting on a circuit board that includes a row of conductive contact traces and a ground trace comprising:

a connector housing assembly having a substantially flat solderable bottom metal surface area which can rest stably on the board and which can be soldered to the ground trace; and a row of contacts, each having a main contact portion lying within said housing assembly at a location above said bottom surface area and fixed to said housing assembly, each contact having an elongated and bendable tail extending from said main contact portion and at a downward incline away from said housing assembly to rest on and be soldered to one of the contact traces when the housing assembly rests stably on the board;

said housing assembly including a housing formed of insulative material and having a rear end from which said tails extend and an opposite front end and said housing assembly also including a grounding plate with a front part lying on the front end of said housing, said contacts having front ends opposite said tails and said front part of said grounding plate substantially surrounding said front end of said contacts; and said grounding plate including a solderable metal bottom portion lying at the bottom of the housing assembly, said solderable bottom portion including a plurality of recesses which receive solder to form solder fillets therein, to resist movement of the housing assembly parallel to the face of the circuit board.

2. The connector described in claim 1 wherein:
said housing assembly is devoid of projections extending below its substantially flat bottom surface area.

3. A surface mounting connector for mounting on a circuit board that includes a row of conductive contact traces and a ground trace comprising:

a connector housing assembly having a substantially flat solderable bottom metal surface area which can rest stably on the board and which can be soldered to the ground trace; and a row of contacts, each having a main contact portion lying within said housing assembly at a location above said bottom surface area and fixed to said housing assembly, each contact having an elongated and bendable tail extending from said main contact portion and at a downward incline away from said housing assembly to rest on and be soldered to one of the contact traces when the housing assembly rests stably on the board;

each of said contact tails includes an upper portion nearest the housing and a lower portion whose lower most location has an undeflected height no higher than an imaginary plane on which said substantially flat bottom surface area can stably lie;

the lower portion of each tail has a lesser resistance to bending per unit length than the upper portion of the tail, whereby to provide a rugged upper tail portion and a lower tail portion that can deflect up under a very small load.

4. The connector described in claim 3 wherein:
the lower portion of each tail is formed of the same materials as the upper portion, but the lower portion is heat treated so its material has a lower spring rate than the material of the upper portion.

5. The connector described in claim 3 wherein:
the lower portion of each tail has a lesser thickness than the upper portion of the tail.

6. The connector described in claim 3 wherein:
the lower portion is formed from a relatively lower strength alloy and connected to the upper portion formed from a relatively higher strength alloy.

7. In combination with a circuit board having a connector receiving region, having a first conductive trace in said region for connecting to a connector housing assembly and having a plurality of spaced conductive second traces spaced from said first trace and also lying in said region, a connector comprising:

a connector which includes a housing assembly with front and rear ends and a substantially flat lower surface and which also includes a plurality of contacts extending between said ends, each contact having a tail extending from the rear end of the housing with each tail extending at a rearward downward incline and having a lower portion which extends to a level slightly lower than said lower surface;

said housing assembly including a housing of insulative material and a metal plate which includes a portion that lies at the level of the lower surface of the housing and which forms a portion of the lower surface of the housing assembly;

said housing assembly being constructed to lie on said circuit board, with said flat lower surface lying flat against said circuit board, with said flat portion lying against said first conductive trace and with said tails lying against said second traces;

said lower portions of said tails lying a small distance below the level of said lower housing assembly surface, and said tails being bendable so they are deflected to lie at the same height, as said lower housing assembly surface solely by the weight of said housing.

8. The combination described in claim 7 wherein:
said housing assembly is devoid of projections extending below its substantially flat lower surface.

9. The combination described in claim 7 wherein:
each of said contact tails includes an upper portion nearest the housing and a lower portion whose lowermost location has an undeflected height no higher than an imaginary plane on which said substantially flat housing bottom can stably lie;
the lower portion of each tail has a lesser resistance to bending than the upper portion of the tail, whereby to provide a rugged upper portion and a lower portion that can deflect upwardly under a very small force.

10. The combination described in claim 9 wherein:
the lower portion of each tail is formed of substantially the same material as the upper portion, but the lower portion is heat treated so its material has a lower spring rate than the material of the upper portion.

11. The combination described in claim 9 wherein:
the lower portion of each tail has a lesser thickness than the upper portion of the tail.

12. The combination described in claim 9 wherein:
the lower portion is formed from a relatively lower strength alloy and is connected to the upper portion formed from a relatively higher strength alloy.

* * * * *